US009823294B1

(12) United States Patent
Aiello et al.

(10) Patent No.: US 9,823,294 B1
(45) Date of Patent: Nov. 21, 2017

(54) NEGATIVE VOLTAGE TESTING METHODOLOGY AND TESTER

(71) Applicant: Western Digital Technologies, Inc., Irvine, CA (US)

(72) Inventors: Christopher Aiello, Davis, CA (US); Ryan P. Mayo, Irvine, CA (US); William K. Laird, Corona, CA (US); John R. Agness, Laguna Hills, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 265 days.

(21) Appl. No.: 14/278,957

(22) Filed: May 15, 2014

Related U.S. Application Data

(60) Provisional application No. 61/897,152, filed on Oct. 29, 2013.

(51) Int. Cl.
*G01R 31/28* (2006.01)

(52) U.S. Cl.
CPC .................. *G01R 31/2836* (2013.01)

(58) Field of Classification Search
CPC .................................. G01R 31/2836
USPC ....................................... 324/537
See application file for complete search history.

(56) References Cited

U.S. PATENT DOCUMENTS

| 3,657,555 | A | | 4/1972 | Hoffman | |
|---|---|---|---|---|---|
| 5,006,807 | A | * | 4/1991 | Blum | G01R 31/316 324/537 |
| 6,014,283 | A | | 1/2000 | Codilian et al. | |
| 6,052,076 | A | | 4/2000 | Patton, III et al. | |
| 6,052,250 | A | | 4/2000 | Golowka et al. | |
| 6,067,206 | A | | 5/2000 | Hull et al. | |
| 6,078,453 | A | | 6/2000 | Dziallo et al. | |
| 6,091,564 | A | | 7/2000 | Codilian et al. | |
| 6,094,020 | A | | 7/2000 | Goretzki et al. | |
| 6,101,065 | A | | 8/2000 | Alfred et al. | |
| 6,104,153 | A | | 8/2000 | Codilian et al. | |
| 6,122,133 | A | | 9/2000 | Nazarian et al. | |
| 6,122,135 | A | | 9/2000 | Stich | |
| 6,141,175 | A | | 10/2000 | Nazarian et al. | |
| 6,147,523 | A | | 11/2000 | Hojabri | |
| 6,160,368 | A | | 12/2000 | Plutowski | |
| 6,181,502 | B1 | | 1/2001 | Hussein et al. | |
| 6,195,222 | B1 | | 2/2001 | Heminger et al. | |
| 6,198,584 | B1 | | 3/2001 | Codilian et al. | |
| 6,198,590 | B1 | | 3/2001 | Codilian et al. | |
| 6,204,988 | B1 | | 3/2001 | Codilian et al. | |
| 6,243,223 | B1 | | 6/2001 | Elliott et al. | |
| 6,281,652 | B1 | | 8/2001 | Ryan et al. | |

(Continued)

FOREIGN PATENT DOCUMENTS

WO   2013093431   12/2012

*Primary Examiner* — Melissa Koval
*Assistant Examiner* — Rahul Maini
(74) *Attorney, Agent, or Firm* — Foley & Lardner LLP

(57) ABSTRACT

A negative voltage testing including a monitoring and triggering circuit coupled to a supply voltage rail of a device under test (DUT) and a switching circuit coupled to the monitoring and triggering circuit. The monitoring and triggering circuit is configured to cause the switching circuit to provide a first negative voltage to the supply voltage rail when a supply voltage on the supply voltage rail decays below a predetermined level during a first test of the DUT.

21 Claims, 4 Drawing Sheets

(56) References Cited

U.S. PATENT DOCUMENTS

| | | |
|---|---|---|
| 6,285,521 B1 | 9/2001 | Hussein |
| 6,292,320 B1 | 9/2001 | Mason et al. |
| 6,310,742 B1 | 10/2001 | Nazarian et al. |
| 6,320,718 B1 | 11/2001 | Bouwkamp et al. |
| 6,342,984 B1 | 1/2002 | Hussein et al. |
| 6,347,018 B1 | 2/2002 | Kadlec et al. |
| 6,369,972 B1 | 4/2002 | Codilian et al. |
| 6,369,974 B1 | 4/2002 | Asgari et al. |
| 6,462,896 B1 | 10/2002 | Codilian et al. |
| 6,476,996 B1 | 11/2002 | Ryan |
| 6,484,577 B1 | 11/2002 | Bennett |
| 6,493,169 B1 | 12/2002 | Ferris et al. |
| 6,496,324 B1 | 12/2002 | Golowka et al. |
| 6,498,698 B1 | 12/2002 | Golowka et al. |
| 6,507,450 B1 | 1/2003 | Elliott |
| 6,534,936 B2 | 3/2003 | Messenger et al. |
| 6,538,839 B1 | 3/2003 | Ryan |
| 6,545,835 B1 | 4/2003 | Codilian et al. |
| 6,549,359 B1 | 4/2003 | Bennett et al. |
| 6,549,361 B1 | 4/2003 | Bennett et al. |
| 6,560,056 B1 | 5/2003 | Ryan |
| 6,568,268 B1 | 5/2003 | Bennett |
| 6,574,062 B1 | 6/2003 | Bennett et al. |
| 6,577,465 B1 | 6/2003 | Bennett et al. |
| 6,614,615 B1 | 9/2003 | Ju et al. |
| 6,614,618 B1 | 9/2003 | Sheh et al. |
| 6,636,377 B1 | 10/2003 | Yu et al. |
| 6,690,536 B1 | 2/2004 | Ryan |
| 6,693,764 B1 | 2/2004 | Sheh et al. |
| 6,707,635 B1 | 3/2004 | Codilian et al. |
| 6,710,953 B1 | 3/2004 | Vallis et al. |
| 6,710,966 B1 | 3/2004 | Codilian et al. |
| 6,714,371 B1 | 3/2004 | Codilian |
| 6,714,372 B1 | 3/2004 | Codilian et al. |
| 6,724,564 B1 | 4/2004 | Codilian et al. |
| 6,731,450 B1 | 5/2004 | Codilian et al. |
| 6,735,041 B1 | 5/2004 | Codilian et al. |
| 6,738,220 B1 | 5/2004 | Codilian |
| 6,747,837 B1 | 6/2004 | Bennett |
| 6,760,186 B1 | 7/2004 | Codilian et al. |
| 6,788,483 B1 | 9/2004 | Ferris et al. |
| 6,791,785 B1 | 9/2004 | Messenger et al. |
| 6,795,268 B1 | 9/2004 | Ryan |
| 6,819,518 B1 | 11/2004 | Melkote et al. |
| 6,826,006 B1 | 11/2004 | Melkote et al. |
| 6,826,007 B1 | 11/2004 | Patton, III |
| 6,847,502 B1 | 1/2005 | Codilian |
| 6,850,383 B1 | 2/2005 | Bennett |
| 6,850,384 B1 | 2/2005 | Bennett |
| 6,867,944 B1 | 3/2005 | Ryan |
| 6,876,508 B1 | 4/2005 | Patton, III et al. |
| 6,882,496 B1 | 4/2005 | Codilian et al. |
| 6,885,514 B1 | 4/2005 | Codilian et al. |
| 6,900,958 B1 | 5/2005 | Yi et al. |
| 6,900,959 B1 | 5/2005 | Gardner et al. |
| 6,903,897 B1 | 6/2005 | Wang et al. |
| 6,914,740 B1 | 7/2005 | Tu et al. |
| 6,914,743 B1 | 7/2005 | Narayana et al. |
| 6,920,004 B1 | 7/2005 | Codilian et al. |
| 6,924,959 B1 | 8/2005 | Melkote et al. |
| 6,924,960 B1 | 8/2005 | Melkote et al. |
| 6,924,961 B1 | 8/2005 | Melkote et al. |
| 6,934,114 B1 | 8/2005 | Codilian et al. |
| 6,934,135 B1 | 8/2005 | Ryan |
| 6,937,420 B1 | 8/2005 | McNab et al. |
| 6,937,423 B1 | 8/2005 | Ngo et al. |
| 6,952,322 B1 | 10/2005 | Codilian et al. |
| 6,954,324 B1 | 10/2005 | Tu et al. |
| 6,958,881 B1 | 10/2005 | Codilian et al. |
| 6,963,465 B1 | 11/2005 | Melkote et al. |
| 6,965,488 B1 | 11/2005 | Bennett |
| 6,967,458 B1 | 11/2005 | Bennett et al. |
| 6,967,811 B1 | 11/2005 | Codilian et al. |
| 6,970,319 B1 | 11/2005 | Bennett et al. |
| 6,972,539 B1 | 12/2005 | Codilian et al. |
| 6,972,540 B1 | 12/2005 | Wang et al. |
| 6,972,922 B1 | 12/2005 | Subrahmanyam et al. |
| 6,975,480 B1 | 12/2005 | Codilian et al. |
| 6,977,789 B1 | 12/2005 | Cloke |
| 6,980,389 B1 | 12/2005 | Kupferman |
| 6,987,636 B1 | 1/2006 | Chue et al. |
| 6,987,639 B1 | 1/2006 | Yu |
| 6,989,954 B1 | 1/2006 | Lee et al. |
| 6,992,848 B1 | 1/2006 | Agarwal et al. |
| 6,992,851 B1 | 1/2006 | Cloke |
| 6,992,852 B1 | 1/2006 | Ying et al. |
| 6,995,941 B1 | 2/2006 | Miyamura et al. |
| 6,999,263 B1 | 2/2006 | Melkote et al. |
| 6,999,267 B1 | 2/2006 | Melkote et al. |
| 7,006,320 B1 | 2/2006 | Bennett et al. |
| 7,016,134 B1 | 3/2006 | Agarwal et al. |
| 7,023,637 B1 | 4/2006 | Kupferman |
| 7,023,640 B1 | 4/2006 | Codilian et al. |
| 7,027,256 B1 | 4/2006 | Subrahmanyam et al. |
| 7,027,257 B1 | 4/2006 | Kupferman |
| 7,035,026 B2 | 4/2006 | Codilian et al. |
| 7,046,472 B1 | 5/2006 | Melkote et al. |
| 7,050,249 B1 | 5/2006 | Chue et al. |
| 7,050,254 B1 | 5/2006 | Yu et al. |
| 7,050,258 B1 | 5/2006 | Codilian |
| 7,054,098 B1 | 5/2006 | Yu et al. |
| 7,061,714 B1 | 6/2006 | Yu |
| 7,064,918 B1 | 6/2006 | Codilian et al. |
| 7,068,451 B1 | 6/2006 | Wang et al. |
| 7,068,459 B1 | 6/2006 | Cloke et al. |
| 7,068,461 B1 | 6/2006 | Chue et al. |
| 7,068,463 B1 | 6/2006 | Ji et al. |
| 7,088,547 B1 | 8/2006 | Wang et al. |
| 7,095,579 B1 | 8/2006 | Ryan et al. |
| 7,110,208 B1 | 9/2006 | Miyamura et al. |
| 7,110,214 B1 | 9/2006 | Tu et al. |
| 7,113,362 B1 | 9/2006 | Lee et al. |
| 7,113,365 B1 | 9/2006 | Ryan et al. |
| 7,116,505 B1 | 10/2006 | Kupferman |
| 7,126,781 B1 | 10/2006 | Bennett |
| 7,158,329 B1 | 1/2007 | Ryan |
| 7,180,703 B1 | 2/2007 | Subrahmanyam et al. |
| 7,184,230 B1 | 2/2007 | Chue et al. |
| 7,196,864 B1 | 3/2007 | Yi et al. |
| 7,199,966 B1 | 4/2007 | Tu et al. |
| 7,203,021 B1 | 4/2007 | Ryan et al. |
| 7,209,321 B1 | 4/2007 | Bennett |
| 7,212,364 B1 | 5/2007 | Lee |
| 7,212,374 B1 | 5/2007 | Wang et al |
| 7,215,504 B1 | 5/2007 | Bennett |
| 7,224,546 B1 | 5/2007 | Orakcilar et al. |
| 7,248,426 B1 | 7/2007 | Weerasooriya et al. |
| 7,251,098 B1 | 7/2007 | Wang et al. |
| 7,253,582 B1 | 8/2007 | Ding et al. |
| 7,253,989 B1 | 8/2007 | Lau et al. |
| 7,265,933 B1 | 9/2007 | Phan et al. |
| 7,287,169 B2 * | 10/2007 | Youssef ............... G01R 22/066 711/109 |
| 7,289,288 B1 | 10/2007 | Tu |
| 7,298,574 B1 | 11/2007 | Melkote et al. |
| 7,301,717 B1 | 11/2007 | Lee et al. |
| 7,304,819 B1 | 12/2007 | Melkote et al. |
| 7,330,019 B1 | 2/2008 | Bennett |
| 7,330,327 B1 | 2/2008 | Chue et al. |
| 7,333,280 B1 | 2/2008 | Lifchits et al. |
| 7,333,290 B1 | 2/2008 | Kupferman |
| 7,339,761 B1 | 3/2008 | Tu et al. |
| 7,348,836 B1 | 3/2008 | Velmurugan |
| 7,365,932 B1 | 4/2008 | Bennett |
| 7,388,728 B1 | 6/2008 | Chen et al. |
| 7,391,583 B1 | 6/2008 | Sheh et al. |
| 7,391,584 B1 | 6/2008 | Sheh et al. |
| 7,433,143 B1 | 10/2008 | Ying et al. |
| 7,440,210 B1 | 10/2008 | Lee |
| 7,440,225 B1 | 10/2008 | Chen et al. |
| 7,450,334 B1 | 11/2008 | Wang et al. |
| 7,450,336 B1 | 11/2008 | Wang et al. |
| 7,453,661 B1 | 11/2008 | Jang et al. |
| 7,457,071 B1 | 11/2008 | Sheh |

(56) References Cited

U.S. PATENT DOCUMENTS

| | | |
|---|---|---|
| 7,466,509 B1 | 12/2008 | Chen et al. |
| 7,468,855 B1 | 12/2008 | Weerasooriya et al. |
| 7,477,471 B1 | 1/2009 | Nemshick et al. |
| 7,480,116 B1 | 1/2009 | Bennett |
| 7,489,464 B1 | 2/2009 | McNab et al. |
| 7,492,546 B1 | 2/2009 | Miyamura |
| 7,495,857 B1 | 2/2009 | Bennett |
| 7,499,236 B1 | 3/2009 | Lee et al. |
| 7,502,192 B1 | 3/2009 | Wang et al. |
| 7,502,195 B1 | 3/2009 | Wu et al. |
| 7,502,197 B1 | 3/2009 | Chue |
| 7,505,223 B1 | 3/2009 | McCornack |
| 7,542,225 B1 | 6/2009 | Ding et al. |
| 7,548,392 B1 | 6/2009 | Desai et al. |
| 7,551,390 B1 | 6/2009 | Wang et al. |
| 7,558,016 B1 | 7/2009 | Le et al. |
| 7,573,670 B1 | 8/2009 | Ryan et al. |
| 7,576,941 B1 | 8/2009 | Chen et al. |
| 7,580,212 B1 | 8/2009 | Li et al. |
| 7,583,470 B1 | 9/2009 | Chen et al. |
| 7,595,954 B1 | 9/2009 | Chen et al. |
| 7,602,575 B1 | 10/2009 | Lifchits et al. |
| 7,616,399 B1 | 11/2009 | Chen et al. |
| 7,619,844 B1 | 11/2009 | Bennett |
| 7,626,782 B1 | 12/2009 | Yu et al. |
| 7,630,162 B2 | 12/2009 | Zhao et al. |
| 7,639,447 B1 | 12/2009 | Yu et al. |
| 7,656,604 B1 | 2/2010 | Liang et al. |
| 7,656,607 B1 | 2/2010 | Bennett |
| 7,660,067 B1 | 2/2010 | Ji et al. |
| 7,663,835 B1 | 2/2010 | Yu et al. |
| 7,675,707 B1 | 3/2010 | Liu et al. |
| 7,679,854 B1 | 3/2010 | Narayana et al. |
| 7,688,534 B1 | 3/2010 | McCornack |
| 7,688,538 B1 | 3/2010 | Chen et al. |
| 7,688,539 B1 | 3/2010 | Bryant et al. |
| 7,697,233 B1 | 4/2010 | Bennett et al. |
| 7,701,661 B1 | 4/2010 | Bennett |
| 7,710,100 B2 * | 5/2010 | Xiong .................. G01R 31/319 324/537 |
| 7,710,676 B1 | 5/2010 | Chue |
| 7,715,138 B1 | 5/2010 | Kupferman |
| 7,729,079 B1 | 6/2010 | Huber |
| 7,733,189 B1 | 6/2010 | Bennett |
| 7,746,592 B1 | 6/2010 | Liang et al. |
| 7,746,594 B1 | 6/2010 | Guo et al. |
| 7,746,595 B1 | 6/2010 | Guo et al. |
| 7,760,461 B1 | 7/2010 | Bennett |
| 7,800,853 B1 | 9/2010 | Guo et al. |
| 7,800,856 B1 | 9/2010 | Bennett et al. |
| 7,800,857 B1 | 9/2010 | Calaway et al. |
| 7,839,591 B1 | 11/2010 | Weerasooriya et al. |
| 7,839,595 B1 | 11/2010 | Chue et al. |
| 7,839,600 B1 | 11/2010 | Babinski et al. |
| 7,843,662 B1 | 11/2010 | Weerasooriya et al. |
| 7,852,588 B1 | 12/2010 | Ferris et al. |
| 7,852,592 B1 | 12/2010 | Liang et al. |
| 7,864,481 B1 | 1/2011 | Kon et al. |
| 7,864,482 B1 | 1/2011 | Babinski et al. |
| 7,869,155 B1 | 1/2011 | Wong |
| 7,876,522 B1 | 1/2011 | Calaway et al. |
| 7,876,523 B1 | 1/2011 | Panyavoravaj et al. |
| 7,916,415 B1 | 3/2011 | Chue |
| 7,916,416 B1 | 3/2011 | Guo et al. |
| 7,916,420 B1 | 3/2011 | McFadyen et al. |
| 7,916,422 B1 | 3/2011 | Guo et al. |
| 7,929,238 B1 | 4/2011 | Vasquez |
| 7,961,422 B1 | 6/2011 | Chen et al. |
| 8,000,053 B1 | 8/2011 | Anderson |
| 8,030,959 B2 * | 10/2011 | Franco ............. G01R 31/31721 324/750.3 |
| 8,031,423 B1 | 10/2011 | Tsai et al. |
| 8,054,022 B1 | 11/2011 | Ryan et al. |
| 8,059,357 B1 | 11/2011 | Knigge et al. |
| 8,059,360 B1 | 11/2011 | Melkote et al. |
| 8,072,703 B1 | 12/2011 | Calaway et al. |
| 8,077,428 B1 | 12/2011 | Chen et al. |
| 8,078,901 B1 | 12/2011 | Meyer et al. |
| 8,081,395 B1 | 12/2011 | Ferris |
| 8,085,020 B1 | 12/2011 | Bennett |
| 8,116,023 B1 | 2/2012 | Kupferman |
| 8,145,934 B1 | 3/2012 | Ferris et al. |
| 8,179,626 B1 | 5/2012 | Ryan et al. |
| 8,189,286 B1 | 5/2012 | Chen et al. |
| 8,213,106 B1 | 7/2012 | Guo et al. |
| 8,254,222 B1 | 8/2012 | Tang |
| 8,300,348 B1 | 10/2012 | Liu et al. |
| 8,315,005 B1 | 11/2012 | Zou et al. |
| 8,320,069 B1 | 11/2012 | Knigge et al. |
| 8,351,174 B1 | 1/2013 | Gardner et al. |
| 8,358,114 B1 | 1/2013 | Ferris et al. |
| 8,358,145 B1 | 1/2013 | Ferris et al. |
| 8,390,367 B1 | 3/2013 | Bennett |
| 8,432,031 B1 | 4/2013 | Agness et al. |
| 8,432,629 B1 | 4/2013 | Rigney et al. |
| 8,451,697 B1 | 5/2013 | Rigney et al. |
| 8,482,873 B1 | 7/2013 | Chue et al. |
| 8,498,076 B1 | 7/2013 | Sheh et al. |
| 8,498,172 B1 | 7/2013 | Patton, III et al. |
| 8,508,881 B1 | 8/2013 | Babinski et al. |
| 8,531,798 B1 | 9/2013 | Xi et al. |
| 8,537,486 B2 | 9/2013 | Liang et al. |
| 8,542,455 B2 | 9/2013 | Huang et al. |
| 8,553,351 B1 | 10/2013 | Narayana et al. |
| 8,564,899 B2 | 10/2013 | Lou et al. |
| 8,576,506 B1 | 11/2013 | Wang et al. |
| 8,605,382 B1 | 12/2013 | Mallary et al. |
| 8,605,384 B1 | 12/2013 | Liu et al. |
| 8,610,391 B1 | 12/2013 | Yang et al. |
| 8,611,040 B1 | 12/2013 | Xi et al. |
| 8,619,385 B1 | 12/2013 | Guo et al. |
| 8,630,054 B2 | 1/2014 | Bennett et al. |
| 8,630,059 B1 | 1/2014 | Chen et al. |
| 8,634,154 B1 | 1/2014 | Rigney et al. |
| 8,634,283 B1 | 1/2014 | Rigney et al. |
| 8,643,976 B1 | 2/2014 | Wang et al. |
| 8,649,121 B1 | 2/2014 | Smith et al. |
| 8,654,466 B1 | 2/2014 | McFadyen |
| 8,654,467 B1 | 2/2014 | Wong et al. |
| 8,665,546 B1 | 3/2014 | Zhao et al. |
| 8,665,551 B1 | 3/2014 | Rigney et al. |
| 8,670,206 B1 | 3/2014 | Liang et al. |
| 8,687,312 B1 | 4/2014 | Liang |
| 8,693,123 B1 | 4/2014 | Guo et al. |
| 8,693,134 B1 | 4/2014 | Xi et al. |
| 8,699,173 B1 | 4/2014 | Kang et al. |
| 8,711,027 B1 | 4/2014 | Bennett |
| 8,717,696 B1 | 5/2014 | Ryan et al. |
| 8,717,699 B1 | 5/2014 | Ferris |
| 8,717,704 B1 | 5/2014 | Yu et al. |
| 8,724,245 B1 | 5/2014 | Smith et al. |
| 8,724,253 B1 | 5/2014 | Liang et al. |
| 8,724,524 B2 | 5/2014 | Urabe et al. |
| 8,737,008 B1 | 5/2014 | Watanabe et al. |
| 8,737,013 B2 | 5/2014 | Zhou et al. |
| 8,743,495 B1 * | 6/2014 | Chen ................ G11B 20/10305 360/55 |
| 8,743,503 B1 | 6/2014 | Tang et al. |
| 8,743,504 B1 | 6/2014 | Bryant et al. |
| 8,749,904 B1 | 6/2014 | Liang et al. |
| 8,760,796 B1 | 6/2014 | Lou et al. |
| 8,767,332 B1 | 7/2014 | Chahwan et al. |
| 8,767,343 B1 | 7/2014 | Helmick et al. |
| 8,767,354 B1 | 7/2014 | Ferris et al. |
| 8,773,787 B1 | 7/2014 | Beker |
| 8,779,574 B1 | 7/2014 | Agness et al. |
| 8,780,473 B1 | 7/2014 | Zhao et al. |
| 8,780,477 B1 | 7/2014 | Guo et al. |
| 8,780,479 B1 | 7/2014 | Helmick et al. |
| 8,780,489 B1 | 7/2014 | Gayaka et al. |
| 8,792,202 B1 | 7/2014 | Wan et al. |
| 8,797,664 B1 | 8/2014 | Guo et al. |
| 8,804,267 B2 | 8/2014 | Huang et al. |

(56) References Cited

U.S. PATENT DOCUMENTS

| | | | |
|---|---|---|---|
| 2005/0218903 A1* | 10/2005 | Reddy | G01R 31/31928 324/520 |
| 2007/0090820 A1* | 4/2007 | Kodera | G01R 31/3004 323/282 |
| 2010/0035085 A1 | 2/2010 | Jung et al. | |
| 2012/0187969 A1 | 7/2012 | Hess | |
| 2012/0284493 A1 | 11/2012 | Lou et al. | |
| 2013/0120870 A1 | 5/2013 | Zhou et al. | |
| 2013/0148240 A1 | 6/2013 | Ferris et al. | |

* cited by examiner

NEGATIVE VOLTAGE TESTING METHODOLOGY AND TESTER

CROSS REFERENCE TO RELATED APPLICATION

This application claims priority to U.S. Application No. 61/897,152, filed Oct. 29, 2013, for "NEGATIVE VOLTAGE TESTING METHODOLOGY AND TESTER", which is incorporated herein by reference.

BACKGROUND

In an environment where a data storage device, such as a hard disk drive (HDD), a hybrid drive (comprising rotating magnetic media and non-volatile semiconductor memory), or a network attached storage (NAS) device, receives power from a host, negative voltages (such as negative voltages) on the host supply line may result in catastrophic failures depending on the amplitude of the negative voltage. For example, negative voltages have been an issue for certain HDDs and have been linked to heads-on-media failures.

In an effort to test for susceptibility to negative voltages, some HDD manufacturers have used poorly designed consumer power supplies to generate the negative voltages. However, the poorly designed consumer power supplies generally provide inconsistent negative voltages that are undesirable for a reliable negative voltage test process. Thus, it is desirable to provide a negative voltage testing methodology and tester for reliable negative voltage testing.

DETAILED DESCRIPTION

Various embodiments of the present disclosure are directed to negative voltage systems, methods, and testers for testing data storage devices (e.g., disk drives, hybrid drives comprising rotating magnetic media and non-volatile semiconductor memory, or solid state drives) for susceptibility to negative voltages. In various embodiments, a negative voltage tester provides a negative voltage to a supply voltage rail of a device under test (DUT) when the DUT is powered off during each of one or more negative voltage tests of a negative voltage test process for testing the DUT. In various embodiments, an occurrence of a failure condition in the DUT is detected by monitoring (via test equipment) one or more output lines of a power device in the DUT.

While various embodiments are described herein, these embodiments are presented by way of example only, and not intended to limit the scope of protection. Indeed, the novel methods and devices described herein may be embodied in a variety of other forms. Furthermore, various omissions, substitutions and changes in the form of the methods and devices described herein may be made without departing from the scope of protection. To illustrate some of the embodiments, reference will now be made to the figures.

Figure 1:
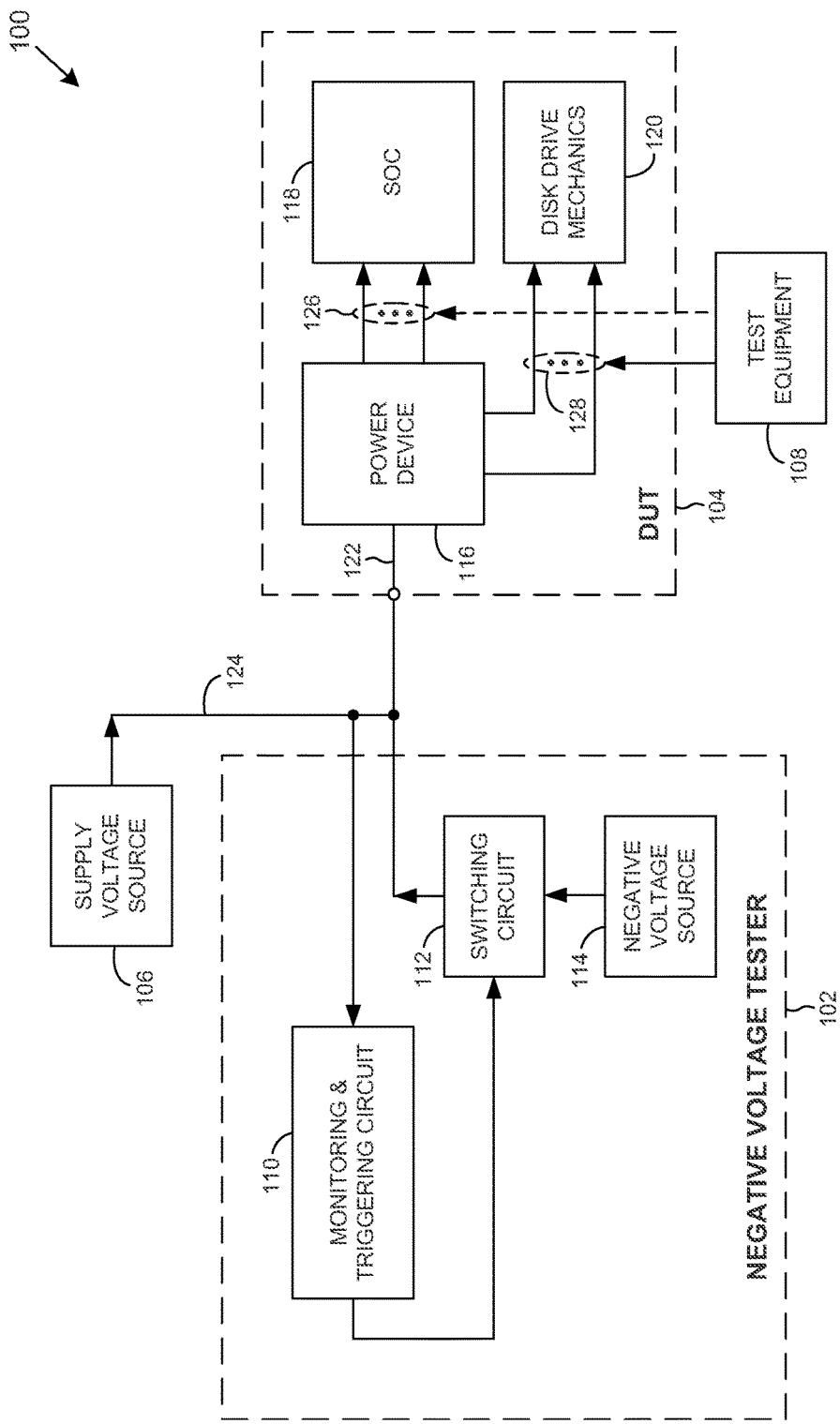
FIG. 1 shows a test system according to an embodiment of the invention comprising a negative voltage tester coupled to a supply voltage source and a device under test (DUT), and test equipment coupled to the DUT, wherein the supply voltage source provides power to the DUT.

FIG. 1 shows a test system 100 according to an embodiment of the invention. As shown in FIG. 1, the test system 100 includes a negative voltage tester 102, a DUT 104, a supply voltage source 106, and test equipment 108. In the embodiment shown in FIG. 1, the DUT 104 may be a data storage device (e.g., a hard disk drive (HDD), hybrid drive (which comprises rotating magnetic media and non-volatile semiconductor memory), network attached storage (NAS) device or solid state drive). In one embodiment, the DUT 104 may be a printed circuit board assembly (PCBA) for a data storage device, wherein the PCBA comprises, for example, a power device (e.g., a power Application-Specific Integrated Circuit (ASIC) or a Power Large Scale Integration (PLSI). In the embodiment shown in FIG. 1, the negative voltage tester 102 (which provides a negative voltage to the DUT 104 during a negative voltage test process) comprises a monitoring and triggering circuit 110, a switching circuit 112, and a negative voltage source 114. As shown in FIG. 1, the DUT 104 comprises a power device 116 (e.g., a power ASIC, a PLSI or a power and motor control IC), a System on a Chip (SoC) 118, disk drive mechanics 120, and a supply voltage rail 122.

As shown in FIG. 1, the supply voltage source 106 is coupled to the supply voltage rail 122 of the DUT 104 via a supply line 124. The supply voltage source 106 provides a supply voltage that is used to power on the DUT 104. For example, the supply voltage can be 5V, 12V, or other suitable voltage as required to power on the DUT. In one embodiment, the supply voltage source 106 is turned on to power on the DUT 104 by providing a supply voltage to the supply voltage rail 122 of the DUT 104 prior to the start of a negative voltage test and turned off at the start of the negative voltage test to power off the DUT 104 and cause the supply voltage on the supply voltage rail 122 to decay. In one embodiment, a switch (not shown in FIG. 1) can be provided in the supply line 124 to couple the supply voltage at the output of the supply voltage source 106 to the supply voltage rail 122, wherein the switch is closed to power on the DUT 104 prior to the start of a negative voltage test and opened to power off the DUT 104 at the start of the negative voltage test.

As shown in FIG. 1, the monitoring and triggering circuit 110 is coupled to the supply voltage rail 122 of the DUT 104 and the switching circuit 112. In one embodiment, the monitoring and triggering circuit may comprise a comparator coupled to a pulse generator, wherein the pulse generator is configured to generate a pulse that is used to trigger the switching circuit 112. In an embodiment of the invention, the monitoring and triggering circuit 110 is configured to monitor a supply voltage on the supply voltage rail 122 and to activate the switching circuit 112 (e.g., via a pulse) when the supply voltage decays below a predetermined level during a negative voltage test of the DUT 104. In one embodiment, the predetermined level may be changed by adjusting one or more components (e.g., variable resistors) in the monitoring and triggering circuit 110.

As shown in the embodiment in FIG. 1, the switching circuit 112 is coupled to the negative voltage source 114, the monitoring and triggering circuit 110 and the supply voltage rail 122 of the DUT 104, and may comprise, for example, a relay or other type of switching device or one or more transistors configured to operate as a switch. In an embodiment, the switching circuit 112 is configured to provide a negative voltage from the negative voltage source 114 when triggered (e.g., via a pulse) from the monitoring and triggering circuit 110 during a negative voltage test of the DUT 104.

In an embodiment in which the switching circuit 112 is controlled by a pulse from the monitoring and triggering circuit 110, the width of the pulse determines the duration that the switch circuit 112 is open to receive a negative voltage from the negative voltage source 114 and, consequently, the duration of the negative voltage that is applied to the supply voltage rail 122 during a negative voltage test of the DUT 104. Thus, in an embodiment of the invention, by controlling the duration (i.e., the length of time) that the switching circuit 112 is open, the switching circuit 112 may be configured to provide a negative voltage having a short duration (i.e., a negative transient voltage) to the supply rail 122 during a negative voltage test of the DUT 104. In one embodiment, the switching circuit 112 may be activated by a signal having constant amplitude so as to cause the switching circuit 112 to provide a negative voltage having a corresponding constant amplitude to the voltage supply rail 122 during a negative voltage test of the DUT 104.

In an embodiment, the negative voltage source 114 is configured to provide a negative voltage to the switching circuit 112 during a negative voltage test process, wherein the negative voltage is increased in amplitude for each subsequent test in the test process until a failure condition occurs in DUT 104. For example, the negative voltage source 114 may provide a negative voltage that starts at −0.1V for a first test and increases in amplitude by −0.1V for each subsequent test in the test process until a failure condition in the DUT 104 is detected. Thus, for example, the negative voltage may have an amplitude of −0.1V in a first test, −0.2V in a second test, and so forth.

Figure 2:
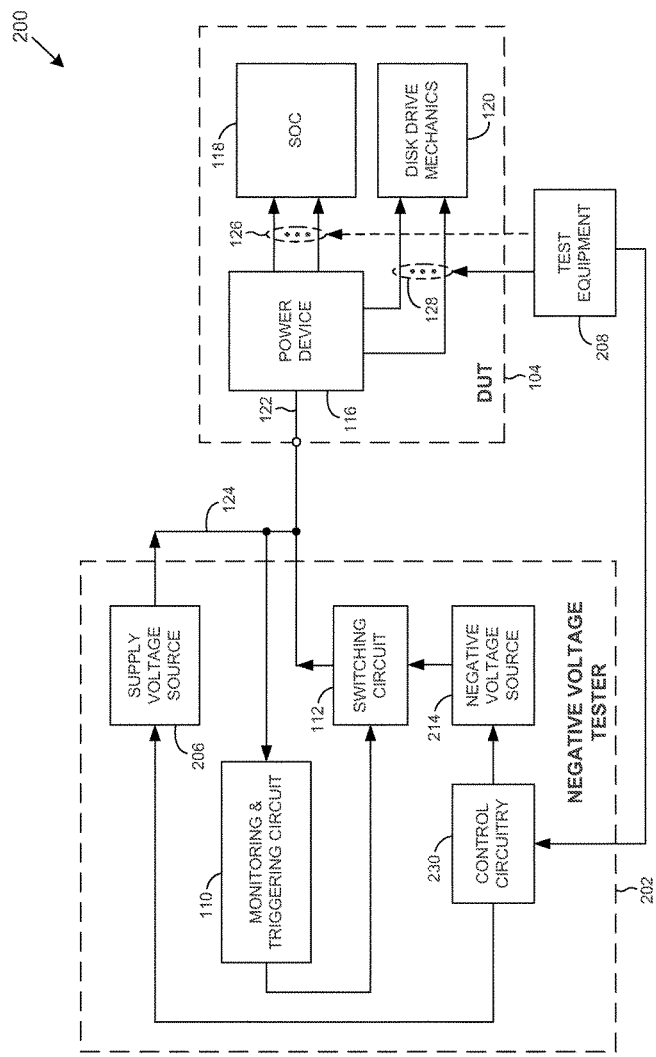
FIG. 2 shows a test system according to an embodiment of the invention comprising a negative voltage tester coupled to a DUT, and test equipment coupled to the negative voltage tester and the DUT, and wherein the negative voltage tester comprises a supply voltage source for providing power to the DUT.

As shown in the embodiment in FIG. 1, the power device 116 is coupled to the SoC 118 via one or more output lines 126, coupled to the disk drive mechanics 120 via one or more output lines 128, coupled to the test equipment 108, and coupled to the supply voltage source 106 and the negative voltage tester 102 via the supply voltage rail 122. The power device 116 may comprise, for example, one or more voltage regulators and other circuitry for providing power to the SoC 118 and the disk drive mechanics 120, as well as other circuitry in the DUT 104 not shown in FIG. 1. In an embodiment, the SoC 118 may comprise, for example, a controller for reading data from and writing data to non-volatile memory (not shown in FIG. 1) (e.g., rotating magnetic media). In an embodiment, disk drive mechanics 120 comprises a VCM and a spindle motor. Although FIGS. 1 and 2 show the SoC 118 and the disk drive mechanics 120 within the DUT 104, those skilled in the art will appreciate that, in some embodiments, other electrical and/or mechanical components may be within DUT 104 (e.g., communications and/or data storage related components) in place of SoC and disk drive mechanics.

In the embodiment shown in FIG. 1, the test equipment 108 is coupled to one or more of output lines 126, 128 (i.e., one or more of output lines 126 and/or one or more of output lines 128) of the power device 116 and is configured to monitor the one or more output lines 126, 128 and detect a failure condition in the power device 116 in the DUT 104 as indicated on the monitored output line(s). For example, an occurrence of a failure condition in the power device 116 in the DUT 104 may be determining by detecting an unexpected change in a profile on the monitored output line(s). For example, a profile may comprise one or signals that are used to perform a particular function in the DUT 104 (such as retracting a head during a power fail occurrence). In one embodiment, the test equipment 108 may comprise an oscilloscope which provides a visual indication of the failure condition as indicated on the one or more monitored output line 126, 128. In one embodiment, the test equipment 108 also records the amplitude and energy of the negative voltage that caused the failure in the power device 116 in the DUT 104 for future analysis.

The operation of a negative voltage test process according to an embodiment of the invention in which the negative voltage tester 102 is utilized to perform one or more negative voltage tests on the DUT 104 will now be discussed. Prior to the first negative voltage test, the negative voltage tester 102, the supply voltage source 106, and the test equipment 108 are coupled to the DUT 104 and the DUT 104 is powered on. In an embodiment, the DUT 104 is powered on when the supply voltage source 106 is turned to provide a supply voltage on the supply voltage rail 122 of the DUT 104. The supply voltage may be, for example, 5V, 12V or other voltage as required to power on the DUT 104.

In one embodiment, prior to the negative voltage test process, an initial zero voltage (0V) test may be performed to ensure that 0V on the supply voltage rail 122 does not cause a failure condition in the power device 116 in the DUT 104. In an embodiment, the DUT 104 is powered off at the beginning of the initial 0V test, thereby causing the supply voltage to decay (i.e., decrease). The monitoring and triggering circuit 110 in the negative voltage tester 102 monitors the supply voltage rail 122, and when the supply voltage on the supply voltage rail 122 decays below a predetermined level, causes the switching circuit 112 to provide 0V from the negative voltage source 114 to the supply voltage rail 122. The test equipment 108 monitors the one or more output lines 126, 128 of the power device 116 to detect an occurrence of a failure condition in the power device 116 in the DUT 104. For example, the failure condition may be indicated by an unexpected change in a profile on one of the monitored output lines of the power device 116.

In one embodiment in which the initial 0V test has been performed, the negative voltage test process starts after the initial 0V test ends without a failure condition in the DUT 104 being detected. For example, the initial 0V test may end if a failure condition has not been detected on the monitored output lines 126, 128 of the power device 116 after a predetermined amount of time has expired from the start of the initial 0V test. In an embodiment in which the initial 0V test has been performed without causing a failure condition in the DUT 104, or in an embodiment in which the initial 0V test is not used, the DUT 104 is powered on prior to the start of the first negative voltage test.

At the beginning of the first negative voltage test, the DUT 104 is powered off to cause the supply voltage on the supply voltage rail 122 to start to decay. The monitoring and triggering circuit 110 monitors the supply voltage rail 122, and when the supply voltage decays below a predetermined level, causes the switching circuit 112 to provide a first negative voltage (e.g., −0.1V) from the negative voltage source 114 to the supply voltage rail 122. The test equipment 108 monitors the one or more output lines 126, 128 of the power device 116 to detect the occurrence of a failure condition in the power device 116 in the DUT 104. If the test equipment 108 detects the occurrence of a failure condition, the negative voltage test process ends. If the first negative voltage test ends without the test equipment 108 detecting the occurrence of a failure condition, a second negative test is performed. In an embodiment, a negative voltage test is designated as ending if a failure condition has not been detected on the monitored output line(s) of the power device 116 after expiration of a predetermined duration from the start of the negative voltage test.

Assuming that the first negative voltage test ends without the first negative voltage causing a failure condition in the power device 116, the DUT 104 is powered on prior to the second negative voltage test. At the beginning of the second negative voltage test, the DUT 104 is powered to cause the supply voltage on the supply voltage rail 122 to start to decay. Similar to the first negative voltage test, the monitoring and triggering circuit 110 monitors the supply voltage rail 122 and causes the switching circuit 112 to provide a second negative voltage to the supply voltage rail 122 when the supply voltage decays below the predetermined level. In an embodiment, the second negative voltage has a higher amplitude than the first negative voltage. For example, if the first negative voltage was −0.1V, the second negative voltage may be −0.2V. In one embodiment, the negative voltage is incremented by a predetermined amount after each negative voltage test that did not result in a failure condition being detected on the monitored output line(s) of the power device 116.

Similar to the first negative voltage test, the test equipment 108 monitors the one or more output lines 126, 128 of the power device 116 for the occurrence of a failure condition in the power device 116 in the DUT 104. If the second negative voltage test causes a failure condition, the negative voltage test process ends. If the second negative voltage test ends without detection of a failure condition in the DUT 104, the negative voltage test process continues until a negative voltage test results in a failure condition being detected in the DUT 104. In one embodiment, the negative voltage test process ends when a predetermined number of negative voltage tests end without a failure condition being detected on the one or more monitored output lines 126, 128 of the power device 116. In one embodiment, the negative voltage test process ends when the amplitude of the negative voltage increases to a predetermined level in a negative voltage test without that test resulting in a failure condition being detected on the one or more monitored output lines 126, 128 of the power device 116.

FIG. 2 shows a test system 200 according to an embodiment of the invention. To avoid duplicate description and preserve brevity, only the differences between the test system 200 in FIG. 2 and the test system 100 in FIG. 1 will be described herein. As shown in FIG. 2, the test system 200 includes a negative voltage tester 202, a DUT 104, and test equipment 208. In the embodiment shown in FIG. 2, the negative voltage tester 202 comprises a monitoring and triggering circuit 110, a switching circuit 112, a supply voltage source 206, a negative voltage source 214, and control circuitry 230. In the embodiment shown in FIG. 2, the control circuitry 230 is coupled to the supply voltage source 206, the negative voltage source 214 and the test equipment 208.

In an embodiment of the invention, the control circuitry 230 is configured to cause a supply voltage to be applied to the supply voltage rail 122 of the DUT 104 to power on the DUT 104 prior to the start of a negative voltage test by turning on the supply voltage source 206. The control circuitry 230 is further configured to cause the supply voltage on the supply voltage rail 122 to decay at the start of the negative voltage test by powering off the DUT 104 by turning off the supply voltage source 206, and is further configured to cause the negative voltage provided by the negative voltage source 214 to be increased in amplitude after each negative voltage test of a negative voltage test process that requires more than one negative voltage test to cause a failure condition in the DUT 104.

In an embodiment of the invention, the test equipment 208 is configured to notify the control circuitry 230 when an indication of a failure condition is detected on the one or more output lines 126, 128 that are monitored by the test equipment 208. In an embodiment, the test equipment 208 is configured to notify the control circuitry 230 when a negative voltage test ends without causing a failure condition in the power device 116 in the DUT 104. In one embodiment, the test equipment 208 is configured to determine that a negative voltage test ends without causing a failure condition when a predetermined amount of time has expired since the start of the negative voltage test without an indication of a failure condition on the one or more monitored output lines 126, 128 of the power device 116.

Figure 3:
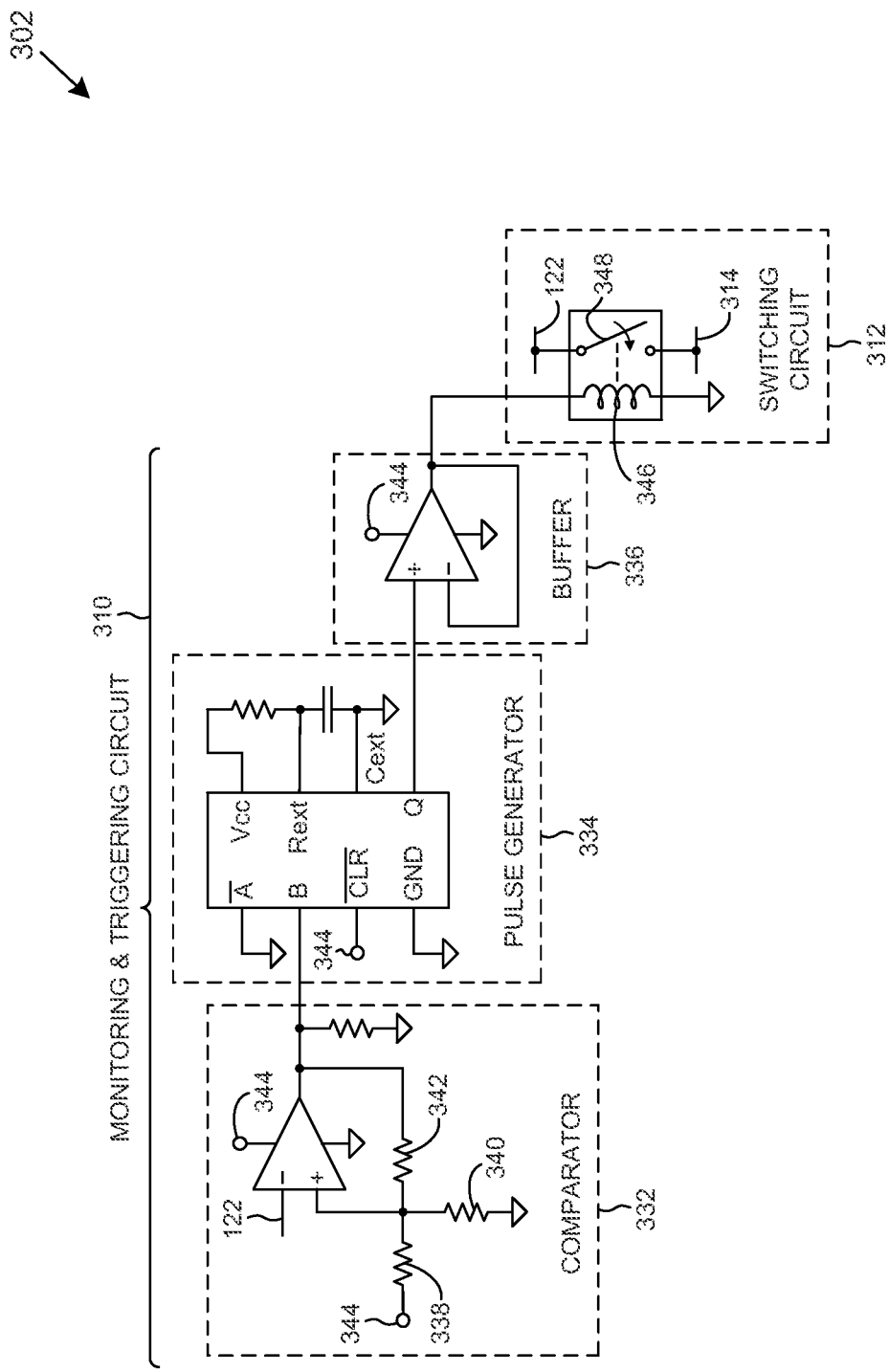
FIG. 3 shows a negative voltage tester according to an embodiment of the invention comprising a comparator, a pulse generator, a buffer, and a switching circuit.

FIG. 3 shows a circuit diagram of a negative voltage tester 302 according to an embodiment of the invention. In the embodiment shown in FIG. 3, the negative voltage tester 302 comprises a monitoring and triggering circuit 310 and a switching circuit 312. In the embodiment shown in FIG. 3, the monitoring and triggering circuit 310 comprises a comparator 332 (e.g., an operational amplifier (op-amp) configured as a comparator), a pulse generator 334 (e.g., a multivibrator), and a buffer 336 (e.g., an op-amp configured as a buffer). In one embodiment, the monitoring and triggering circuit 310 comprises only the comparator 332 and the pulse generator 334. In one embodiment, the monitoring and triggering circuit 310 comprises only the comparator 332, wherein the comparator 332 provides an output pulse that has sufficient power to drive the switching circuit 312.

As shown in FIG. 3, the negative input of the comparator 332 is coupled to the supply voltage rail 122 of the DUT 104 (shown in FIGS. 1 and 2), first terminals of resistors 338, 340, and 342 are coupled to the positive input of the comparator 332, a second terminal of resistor 338 is coupled to tester supply voltage 344, a second terminal of resistor 340 is coupled to ground, and a second terminal of resistor 342 is coupled to the output of the comparator 332. In the embodiment shown in FIG. 3, resistors 338, 340, and 342 determine a reference voltage that is applied to the positive input of the comparator 332. In one embodiment, one of resistors 338 and 340 can be a variable resistor to enable the reference voltage at the positive input of the comparator 332 to be adjustable. In the embodiment shown in FIG. 3, the comparator 332 is configured to change logic states at its output when the supply voltage on the supply voltage rail 122 at its negative input exceeds the reference voltage at its positive input, or vice versa.

As shown in FIG. 3, the output of the comparator 332 is coupled to the B input of the pulse generator 334 and the Q output of the pulse generator 334 is coupled to the positive input of the buffer 336. In the embodiment in FIG. 3, the pulse generator 334 is configured to provide a positive output pulse at the Q output when the B input from the output of the comparator 332 transitions from low-to-high. As shown in FIG. 3, the output of the buffer 336 is coupled to a first terminal of an inductor 346 in the switching circuit 312, a second terminal of the inductor 346 is coupled to ground, a first terminal of a switch 348 in the switching circuit 312 is coupled to the supply voltage rail 122 of the DUT 104 (shown in FIGS. 1 and 2), and a second terminal of the switch 348 is coupled to a negative voltage source 314 (e.g., negative voltage source 114 in FIG. 1 or negative voltage source 214 in FIG. 2). In the embodiment shown in FIG. 3, the switching circuit 312 comprises a relay. In other embodiments, the switching circuit 312 can comprise, for example, one or more semiconductor devices (e.g., one or more transistors) configured to operate as a switch.

In the embodiment shown in FIG. 3, the buffer 336 is configured to match the high impedance of the Q output of the pulse generator 334 to the low impedance of the inductor 346 in the switching circuit 312 and drive the switching circuit 312. In the embodiment shown in FIG. 3, the switch circuit 312 is configured to provide a negative voltage from the negative voltage source 314 on the second terminal of the switch 348 to the supply voltage rail 122 of the DUT 104 when the inductor 346 is energized from a pulse from the Q output of the pulse generator 334 via the buffer 336.

The operation of the negative voltage tester 302 during a negative voltage test of a DUT (e.g., the DUT 104 shown in FIGS. 1 and 2) will now be discussed. In one embodiment, the comparator 332 compares the supply voltage on the supply voltage rail 122 of the DUT 104 (which is coupled to the negative input of the comparator 332) with the reference voltage (which is coupled to the positive input of the comparator 332). At the start of the negative voltage test, the supply voltage on the supply voltage rail 122 begins to decay when, in an embodiment, the DUT 104 is powered off. When the supply voltage decays below the reference voltage at the positive input of the comparator 332 (which is set at a lower voltage level than the supply voltage), the output (which is coupled to the B input of the pulse generator 334) transitions from a low-to-high voltage level, thereby causing a positive pulse to be generated at the Q output of the pulse generator 334.

The positive pulse from the pulse generator is transmitted via the buffer 336 to the inductor 346 in the switching circuit 312 and causes it (the inductor 346) to energize. When the inductor 346 is energized, it causes the switch 348 in the switching circuit 312 to close, thereby providing a negative voltage from the negative voltage source 314 to the supply voltage rail 122 of the DUT 104. The positive pulse from the pulse generator has a relatively short duration, which causes the negative voltage from the negative voltage source 314 to have a correspondingly short duration, since the switch 348 remains closed (and providing the negative voltage to the supply voltage rail 122) only as long as the inductor 346 (which magnetically controls the switch 348) remains energized by the positive pulse. The effect of the negative voltage on the power device 116 in the DUT 104 during the negative voltage test is determined in a similar manner as described above with respect to test system 100 in FIG. 1.

Figure 4:
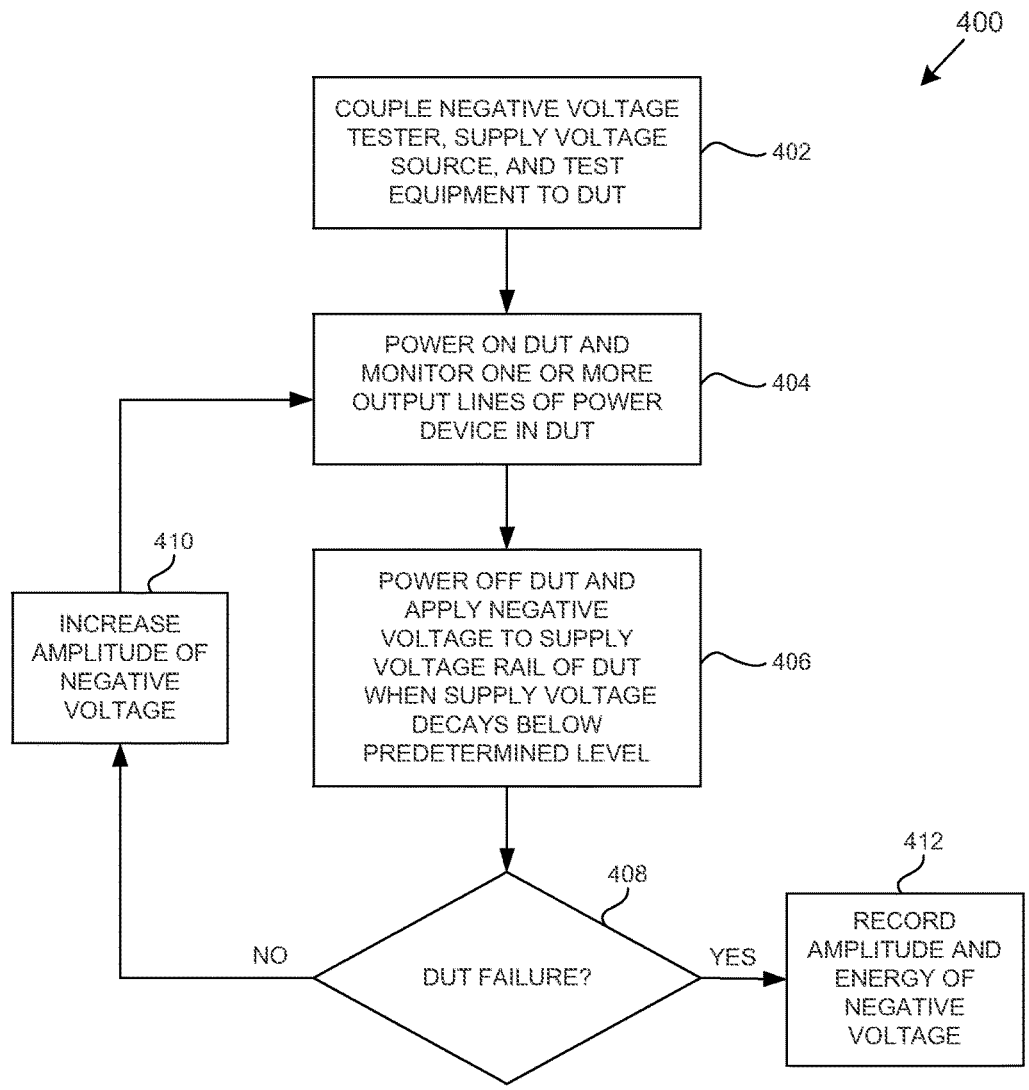
FIG. 4 shows a flow diagram according to an embodiment of the invention wherein a negative voltage tester, a supply voltage source, and test equipment are coupled to a DUT, and the negative voltage tester provides a negative voltage to the DUT that is increased in negative amplitude until a failure condition in the DUT is detected by the test equipment and the amplitude and energy of the negative voltage that caused the failure condition is recorded.

FIG. 4 is a flow diagram of a negative voltage test process according to an embodiment of the invention, wherein a negative voltage tester (e.g., negative voltage tester 102), a supply voltage source (e.g., supply voltage source 106), and test equipment (e.g., test equipment 108) are coupled to a DUT (e.g., DUT 104) (block 402). In one embodiment, the supply voltage source (e.g., supply voltage source 206) located inside the negative voltage tester (e.g., negative voltage tester 202). The DUT is powered on and one or more output lines (e.g., one or more output lines 126, 128) of a power device (e.g., power device 116) in the DUT are monitored by the test equipment (block 404). For example, the DUT may be powered on by turning on the supply voltage source to provide a supply voltage on the supply voltage rail (e.g., supply voltage rail 122). In one embodiment, the supply voltage source (e.g., supply voltage source 206) is turned on by control circuitry (e.g., control circuitry 230) in the negative voltage tester (e.g., negative voltage tester 202).

The DUT is powered off to begin a negative voltage test and a negative voltage is applied to the supply voltage rail of the DUT when a supply voltage on the supply voltage rail decays below a predetermined level (block 406). For example, the DUT may be powered off by turning off the supply voltage source (which provides the supply voltage to the supply voltage rail to power on the DUT). In one embodiment, the DUT may be powered off by opening a switch that is inserted in the supply line (e.g., supply line 124) that couples the supply voltage source to the supply voltage rail of the DUT. In one embodiment, the supply voltage source is turned off by control circuitry (e.g., control circuitry 230) in the negative voltage tester (e.g., negative voltage tester 202).

During the negative voltage test, when an occurrence of a failure condition is determined in the power device in the DUT (block 408), the amplitude and energy of the negative voltage that caused the failure condition is recorded (block 412). For example, an occurrence of a failure condition in the power device may be determined by detecting an unexpected change in a profile on the one or more output lines of the power device that are monitored by the test equipment. In one embodiment, the unexpected change in a profile on the one or more output lines that indicates the occurrence of a failure condition may be visually displayed by the test equipment.

However, if a failure condition in the power device is not detected during the negative voltage test (i.e., the negative voltage test ends without a failure condition being detected), the amplitude of the negative voltage is increased (block 410) and the DUT is powered on prior to the start of a next negative voltage test in the negative voltage test process (block 404). The negative voltage test process as described above continues by increasing the amplitude of the negative transition voltage in each successive test until an occurrence of a failure condition has been detect on the one or more monitored output lines of the power device in the DUT. In one embodiment, the negative voltage test process ends when a predetermined number of negative voltage tests end without a failure condition being detected in the DUT. In one embodiment, the negative voltage test process ends when the amplitude of the negative voltage increases to a predetermined level in a negative voltage test without that test resulting in a failure condition being detected in the DUT.

It is noted that the blocks (i.e., steps) in the flow diagram in FIG. 4 are shown in a particular order to illustrate an embodiment of the invention. In other embodiments, the blocks in the flow diagram in FIG. 4 may be performed in a different order.

While some embodiments of the invention have been described, these embodiments have been presented by way of example only, and are not intended to limit the scope of the disclosure. Indeed, the novel methods and devices described herein may be embodied in a variety of other forms. Furthermore, various omissions, substitutions and changes in the form of the methods and devices described herein may be made without departing from the spirit of the disclosure. For example, the various components described may be implemented as software and/or firmware on a processor, ASIC/FPGA, or dedicated hardware. As an additional example, some of the above described negative voltage tester embodiments may be used to test power devices in electronic devices other than data storage devices for failure conditions resulting from negative voltages.

Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of protection is defined only by the claims.

What is claimed is:

1. A negative voltage tester comprising:
a monitoring and triggering circuit coupled to a positive supply voltage rail that supplies a positive supply voltage greater than zero to a device under test (DUT); and
a switching circuit coupled to the monitoring and triggering circuit;
wherein the monitoring and triggering circuit is configured to:
perform a negative voltage test of the DUT by causing the switching circuit to provide a first negative voltage to the positive supply voltage rail when the positive supply voltage on the positive supply voltage rail decays below a predetermined level, and
repeat the negative voltage test until failure of the DUT, an amplitude of the negative voltage being increased for each repetition of the negative voltage test,
wherein the DUT comprises a power device coupled to the positive supply voltage rail,
wherein the power device is coupled to test equipment via one or more output lines, and the test equipment is configured to detect a failure condition in the DUT by monitoring the one or more output lines,
wherein the DUT further comprises disk drive mechanics coupled to at least a first one of the output lines of the power device and a system on a chip (SoC) coupled to at least a second one of the output lines of the power device, and wherein the test equipment is coupled to at least one of the first one and the second one of the output lines of the power device.

2. The negative voltage tester as recited in claim 1, further comprising a negative voltage source coupled to the switching circuit and configured to provide the negative voltage to the switching circuit during the negative voltage test.

3. The negative voltage tester as recited in claim 1, wherein the switching circuit is configured to provide the negative voltage to the positive supply voltage rail in response to a signal from the monitoring and triggering circuit.

4. The negative voltage tester as recited in claim 1, wherein the positive supply voltage rail is coupled to a supply voltage source, and wherein the supply voltage source is turned off when the negative voltage test begins to cause the positive supply voltage to decay below the predetermined level.

5. The negative voltage tester as recited in claim 4, wherein the supply voltage source is situated inside the negative voltage tester.

6. The negative voltage tester as recited in claim 1, wherein the DUT is powered on by providing the positive supply voltage on the positive supply voltage rail prior to the start of each negative voltage test, and wherein in the each negative voltage test the DUT is powered off to cause the positive supply voltage on the positive supply voltage rail to decay below the predetermined level.

7. The negative voltage tester as recited in claim 1, wherein the monitoring and triggering circuit comprises a comparator having an output coupled to an input of a pulse generator, and wherein the pulse generator causes the switching circuit to provide the negative voltage to the positive supply voltage rail.

8. A test system for testing a response of a device under test (DUT) to negative voltage, the test system comprising:
a negative voltage tester comprising:
a monitoring and triggering circuit coupled to a positive supply voltage rail to receive a positive supply voltage that is greater than zero; and
a switching circuit coupled to the monitoring and triggering circuit;
wherein the monitoring and triggering circuit is configured to:
perform a negative voltage test of the DUT by causing the switching circuit to provide a negative voltage to the positive supply voltage rail when the positive supply voltage on the positive supply voltage rail decays below a predetermined level, and
repeat the negative voltage test until failure of the DUT, an amplitude of the negative voltage being increased for each repetition of the negative voltage test, and
wherein the DUT comprises a power device coupled to the positive supply voltage rail; and
test equipment coupled to one or more output lines of the power device, and configured to detect a failure condition in the DUT by monitoring the one or more output lines,
wherein the DUT further comprises disk drive mechanics coupled to at least a first one of the output lines of the power device and a system on a chip (SoC) coupled to at least a second one of the output lines of the power device, and wherein the test equipment is coupled to at least one of the first one and the second one of the output lines of the power device.

9. The test system as recited in claim 8, wherein the negative voltage tester further comprises a negative voltage source coupled to the switching circuit and configured to provide the negative voltage to the switching circuit during the negative voltage test.

10. The test system as recited in claim 9, further comprising a supply voltage source coupled to the positive supply voltage rail, and wherein in the negative voltage test the supply voltage source is turned off to cause the positive supply voltage to decay below the predetermined level.

11. The test system as recited in claim 10, wherein the supply voltage source is situated inside the negative voltage tester.

12. The test system as recited in claim 8, wherein the DUT is powered on prior to each negative voltage test performed.

13. The test system as recited in claim 8, wherein the supply voltage source is turned on to power on the DUT prior to the start of each negative voltage test and is turned off at the start of each negative voltage test.

14. The test system as recited in claim 8, wherein the monitoring and triggering circuit comprises a comparator having an output coupled to an input of a pulse generator, and wherein the pulse generator causes the switching circuit to provide the negative voltage to the positive supply voltage rail.

15. A method of using a negative voltage tester to test a device under test (DUT) in a test system comprising the negative voltage tester and the DUT, the DUT comprising a positive supply voltage rail for receiving a positive supply voltage that is greater than zero and a power device coupled to the positive supply voltage rail, the negative voltage tester comprising a monitoring and triggering circuit coupled to the positive supply voltage rail and a switching circuit coupled to the monitoring and triggering circuit and the supply voltage rail, the method comprising:
- causing the switching circuit to provide a negative voltage to the positive supply voltage rail when an initial supply voltage on the positive supply voltage rail decays below a predetermined level during a negative voltage test of the DUT;
- repeating the negative voltage test until failure of the DUT, an amplitude of the negative voltage being increased for each repetition of the negative voltage test, wherein the test system further comprises test equipment coupled to one or more output lines of the power device; and
- detecting a failure condition in the DUT by monitoring the one or more output lines of the power device,
- wherein the DUT further comprises drive mechanics coupled to at least a first one of the output lines of the power device and a system on a chip (SoC) coupled to at least a second one of the output lines of the power device, and wherein the test equipment is coupled to at least one of the first one and the second one of the output lines of the power device.

16. The method as recited in claim 15, wherein:
- the negative voltage tester further comprises a negative voltage source coupled to the switching circuit; and
- the method further comprises providing the negative voltage to the switching circuit during the test.

17. The method as recited in claim 16, wherein:
- the test system further comprises a supply voltage source; and
- the method further comprises, in the negative voltage test, turning off the supply voltage source to cause the positive supply voltage to decay below the predetermined level.

18. The method as recited in claim 17, wherein the supply voltage source is situated inside the negative voltage tester.

19. The method as recited in claim 15, further comprising powering on the DUT prior to the start of each negative voltage test.

20. The method as recited in claim 15
- further comprising turning on the supply voltage source to power on the DUT prior to the start of each negative voltage test and turning off the supply voltage source to power off the DUT at the start of each negative voltage test.

21. The method as recited in claim 15, wherein:
- the monitoring and triggering circuit comprises a comparator having an output coupled to an input of a pulse generator; and
- the method further comprises causing the switching circuit to provide the negative voltage to the positive supply voltage rail by providing a pulse from the pulse generator.

* * * * *